LIGHT EMITTING SILICON CARBIDE SEMICONDUCTOR JUNCTION DEVICES

Filed Jan. 25, 1967 2 Sheets-Sheet 1

INVENTORS
LEONARD B. GRIFFITHS
ABRAHAM I. MLAVSKY
BY
Nicholas A. Pandiscio
ATTORNEY

INVENTORS
LEONARD B. GRIFFITHS
ABRAHAM I. MLAVSKY

Nicholas A. Pandiscio
ATTORNEYS 3,517,281
LIGHT EMITTING SILICON CARBIDE SEMICONDUCTOR JUNCTION DEVICES
Abraham I. Mlavsky, Lexington, and Leonard B. Griffiths, North Reading, Mass., assignors to Tyco Laboratories, Inc., Waltham, Mass., a corporation of Massachusetts
Filed Jan. 25, 1967, Ser. No. 611,727
Int. Cl. H01l *15/00*
U.S. Cl. 317—237 4 Claims

ABSTRACT OF THE DISCLOSURE

A light emitting silicon carbide semiconductor junction device containing a transition metal (such as Ti, Zr, or Mn) which increases the total light output or effects a shift in the peak of the electroluminescence spectrum.

The invention described herein was made in the performance of work under a NASA contract and is subject to the provisions of Section 305 of the National Aeronautics and Space Act of 1958, Public Law 85–568 (72 Stat. 435; 42 U.S.C. 2457).

This invention relates to semiconductor devices and more particularly to improved light emitting semiconductor junction devices made of silicon carbide.

Light emitting semiconductor junction devices have numerous applications. One area of use is in electronic business machines for reading computer punch cards in conjunction with photodiodes. Tungsten bulbs are commonly used for this purpose but their life and reliability are not as good as solid-state emitters.

As is well known the electroluminescence spectrum of light emitting diodes made of α-silicon carbide generally is confined within the limits of about 4500 A. to about 6400 A. (from the blue to orange regions) with peak intensity being under 5500 A. and usually occurring at about 5100–5200 A. (blue green color). It has been appreciated that the utility of such devices would be greatly extended if their electroluminescence could be increased over the entire spectrum or at selected wavelengths.

Accordingly one object of this invention is to improve the overall light output of light emitting silicon carbide semiconductor devices.

Another object of this invention is to improve the light output of silicon carbide semiconductor devices in a particular region of its electroluminescence spectrum.

We have discovered that the electroluminescent behavior of SiC can be quite markedly affected by specific impurities (not dopants in the usual sense) which introduce levels that can be pumped electrically and affect the efficiency of the recombination process involved in emission of radiation. More specifically we have discovered that the introduction of transition metals, notably Ti, Zr and Mn, alters the emission process and thereby affects the electro-optical properties of SiC semiconductor devices.

Accordingly the foregoing objects, as well as other objects which are made apparent from the following detailed description and the accompanying drawings, are accomplished by providing silicon carbide semiconductor junction devices having a selected transition metal at or in the junction region.

Figure 1:
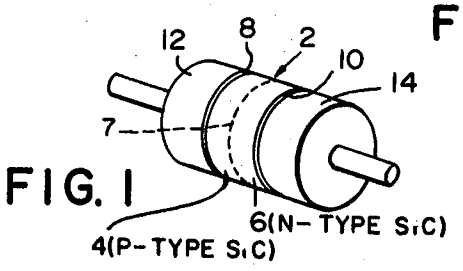
FIG. 1 is a semi-schematic perspective view of a typical device embodying the invention.

Referring now to FIG. 1, the illustrated device comprises a crystal of α-silicon carbide indicated generally at 2 having a doped P-type region 4 and a doped N-type region 6 with a P-N junction region indicated by the dashed line 7. The two doped regions 4 and 6 are provided with relatively thin non-rectifying contacts 8 and 10 respectively that preferably comprise an alloy of gold and tantalum. Soldered to these contacts by standard Pb-Ag solder melting at about 305° C. are heavy copper headers 12 and 14. It is to be understood also that in addition to the dopants that determine the P- and N-type regions the crystal also contains a selected transition metal which may be present in all or only part of each or both of the P- and N-type regions but at the very least is in the junction region. In this connection it is to be appreciated that although the P-N junction is illustrated as abrupt, in practice it has some small but finite dimensions. For best results it appears that the upper limit of the junction width is about 0.4 micron as determined from capacitance measurements at zero bias.

For obvious reasons the crystal material should have the lowest possible resistivity and preferably should not exceed 1.0 ohm cm. but be within the range of 0.01–1.0 ohm cm. The P-type semiconductivity is achieved by using as a dopant a material of the class consisting of boron, gallium or aluminum or mixtures thereof. N-type semiconductivity is achieved by including in the crystal a material of the class consisting of antimony, arsenic, nitrogen, or phosphorus or mixtures thereof. Devices constructed in accordance with this invention should have a carrier concentration of at least $10^{15}$ to $10^{19}$ atoms per cc.

Devices constructed in accordance with this invention may be activated to emission by the application of a forward bias, as, for example, by connection of headers 12 and 14 to a source of direct current of sufficient current capacity to cause the production of radiation from the junction region. In this connection it is to be noted that the device may have a circular geometry as shown or some other suitable geometry, e.g. rectangular. The exterior surface of the crystal should be polished to optical smoothness and exact parallelism perpendicular to the plane of the junction region in order to maximize the light that is emitted radially from the junction region.

Devices embodying the present invention may be made according to a variety of well known processes modified to provide for introduction into the crystal of the selected transition metal. A convenient and preferred process is the one described in our issued Pat. No. 3,205,101, issued Sept. 7, 1965, and entitled "Vacuum Cleaning and Vapor Deposition of Solvent Material Prior to Effective Traveling Solvent Process." Application of this process to produce devices embodying the present invention will now be described. Since the apparatus employed in producing diodes according to the traveling solvent method of crystal growth forms no part of the present invention and is well known and adequately documented in our aforementioned Pat. No. 3,205,101, the following discourse is directed to the essentials of the process as adapted for the purposes of the present invention and a detailed description of the apparatus employed in the process is omitted for purposes of brevity.

A device substantially as illustrated in FIG. 1 is made by taking two flat α-SiC wafers, each about 40 mils thick but one a monocrystalline P-type water doped with approximately $10^{18}$ atoms/cc. of aluminum and the other a monocrystalline N-type water doped with approximately $10^{18}$ atoms/cc. of nitrogen. These wafers are polished and then one surface of each is cleaned by electron bombardment and plated by evaporation deposition with a thin film of chromium having a thickness in the range of 1000 to 10,000 A. Then the two wafers are arranged in a sandwich with their chromium films facing each other and separated by an intervening layer measuring about 5 mils thick of an alloy comprising chromium, silicon carbide and the selected transition metal (Ti, Zr or Mn). Preferably this alloy has a nominal composition by weight of 20% SiC, 2% transition metal, and the remainder chromium.

Figure 3:
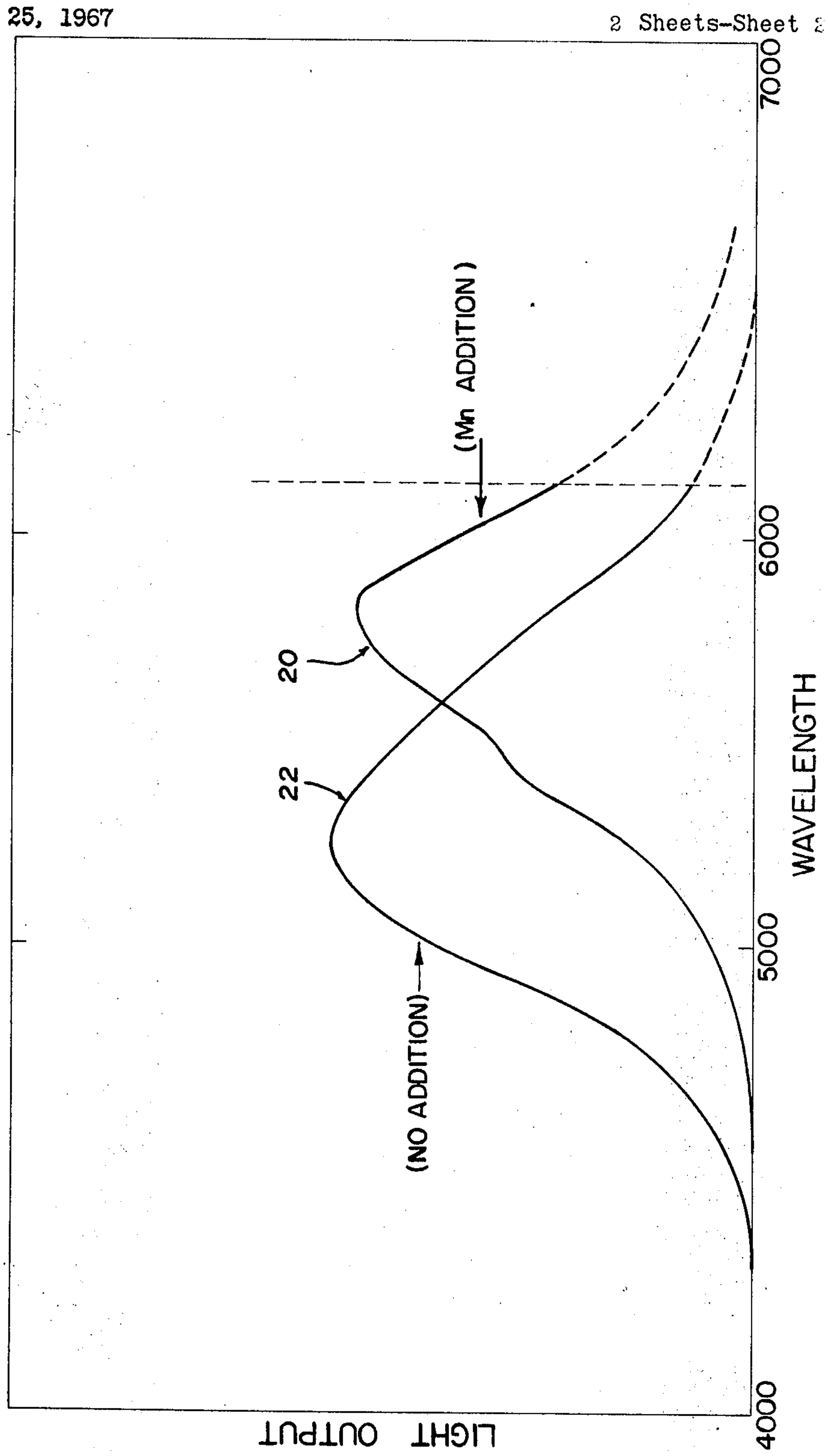
FIG. 3 is a graph which illustrates the effect of Mn on the spectral distribution of silicon carbide diodes.

The sandwich is then heated in accordance with the requirements of the traveling solvent method using a suitable apparatus such as the one shown in FIG. 3 of our prior U.S. Pat. No. 3,205,101. Briefly this apparatus comprises a graphite block mounted within an elongated quartz tube that is surrounded by an RF heating coil that is connected to a suitable power supply. The sandwich is placed on the graphite block with the N-type silicon carbide in contact with the block and the P-type silicon carbide on top. The tube is sealed off and a protective inert atmosphere such as argon (or helium) is fed into the top end of the tube and removed at the bottom end of the tube. This inert gas is pumped through the tube all the while that the heating operation is in progress. With the sandwich in place on the graphite block and the inner atmosphere established within the tube, the RF heating coil is energized. The graphite block heats up rapidly. Cooling from the upper surface of the sandwich occurs by radiation so that a temperature gradient is established across the sandwich with the highest temperature at its bottom end. The heating is controlled so that the temperature on the upper surface of the sandwich is between about 1600° C.–1800° C., and preferably between 1650–1750° C. The temperature is monitored via a conventional recording pyrometer which "sights" the upper surface of the sandwich. The rate of heating is controlled by manually adjusting the power supply. The rate of heating is controlled so that the temperature at the sandwich's upper surface does not vary ±2° C. during this phase of the process. If desired, temperature control may be effected by automatic means. Automatic control of heating may be accomplished by feeding the electrical output from the pyrometer to a conventional feed-back control system that automatically adjusts the power supply for the RF heating coil. The average sandwich temperature is maintained below the melting point of elemental chromium which is approximately 1900° C. so as to minimize loss of chromium from the sandwich by evaporation. Operating so that the upper surface of the sandwich is at a temperature of 1650–1750° C. minimizes interdiffusion (and therefore junction width) across the junction that is formed. The temperature gradient which is established across the sandwich under these conditions is sufficient to cause growth, i.e., solvent zone movement, to occur at a reasonable rate. The heating is continued for about two hours, during which time the alloy of chromium, silicon carbide and transition metal melts and forms a liquid zone which dissolves and travels downward through the N-type silicon carbide. This downward movement of the liquid zone involves dissolution of the N-type bottom layer at the lower liquid-solid interface and regrowth of the dissolved α-silicon carbide at the upper liquid-solid interface. When the process is completed the resulting body is a monocrystal of alpha-silicon carbide comprising a discrete P-type region and a discrete N-type region, with a uniform P-N junction formed at the initial plane of growth and with the transition metal present in the N-type region and at the junction region. At the end of two hours heating is discontinued and the sandwich is removed from the graphite block. Then the chromium layer is sliced off the bottom side of the crystal. The latter is then cut into small sections of appropriate shape and size, e.g., circular as in FIG. 1 or rectangular or square, with a diameter or width of about 25 mils. By a succession of lapping-inspection cycles, each side of the junction is reduced until the total crystal thickness measured from one end to the other is 2½ mils. At this point the position of the junction may be readily determined by visual inspection because of a pronounced color difference between the P- and N-type regions.

Each section or sample is then made into a useable diode by providing it with ohmic contacts. The procedure for providing the contacts includes cleaning the sample in an organic solvent such as alcohol, using ultrasonic agitation, etching the end surfaces with hydrofluoric acid, washing and drying. Thereafter a thin layer of tantalum is sputtered onto each end surface. This is achieved in an argon environment at a pressure of $5\times10^{-2}$ mm. of mercury over a two hour period. Then a thin layer of gold is evaporated over each tantalum layer. The gold and tantalum layers are approximately of the same thickness. For the P-type end of the sample, the gold plating is followed by evaporating on a thin film of aluminum. The total thickness of each contact is only a few tenths of one mil. Then the evaporated metals are alloyed into the ends of the crystal by heat treatment for approximately 15 minutes at 1350° C. in an argon atmosphere. Preferably, but not necessarily, this is followed by evaporation of a thin layer of nickel onto the alloyed end surfaces. The nickel is sintered by heating the sample just below the melting point of nickel. Thereafter the copper headers are soldered onto the ends of the crystal using a standard Pb-Ag solder that melts at 305° C.

Figure 2:
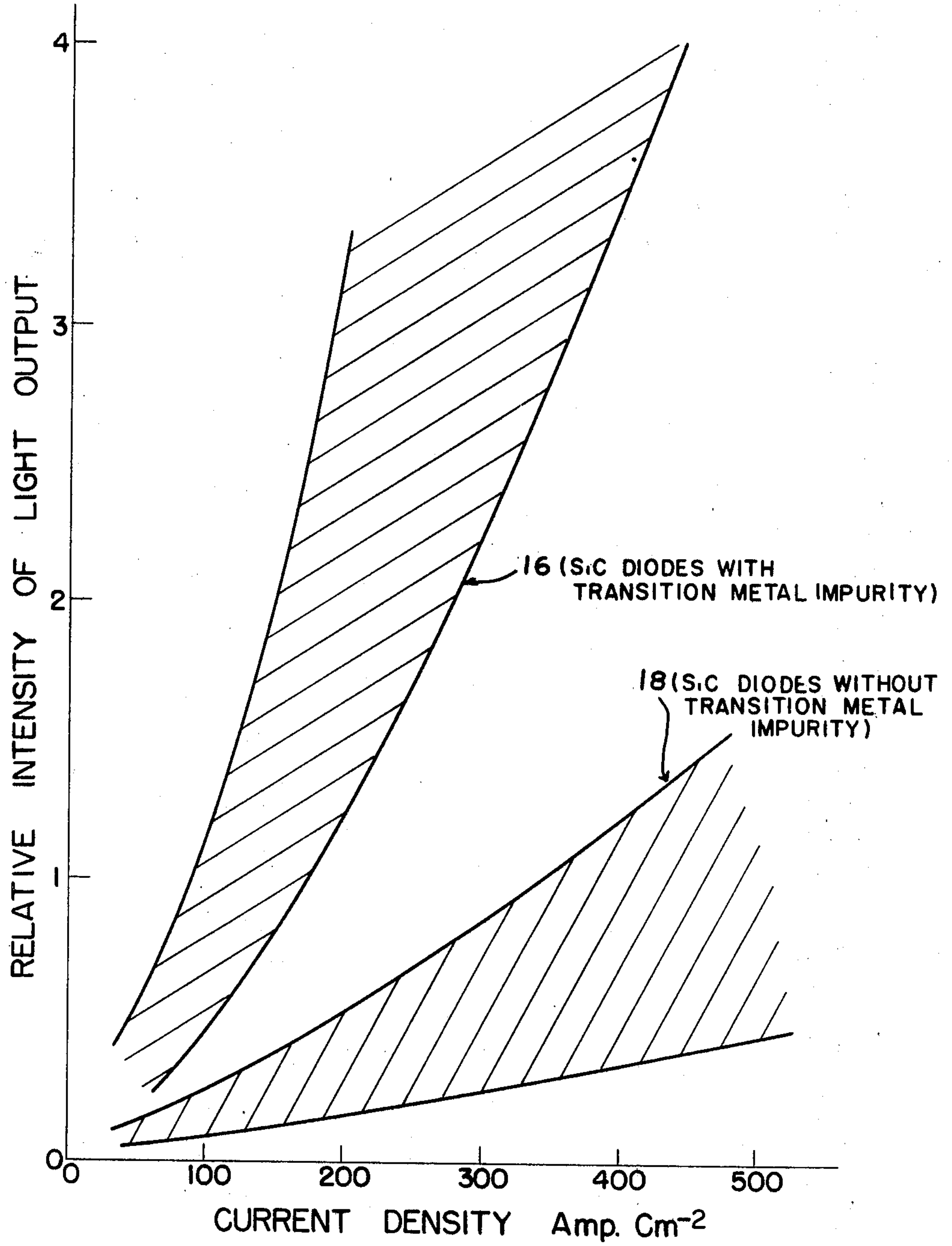
FIG. 2 is a graph which compares the electroluminescence of silicon carbide diodes doped with Ti or Zr and silicon carbide diodes made according to the same method but not doped with Ti or Zr.

The light emitting characteristics of these diodes are different from diodes made according to the same process but without the transition metal. This difference is indicated by FIG. 2 which illustrates the relative intensity of the light outputs of (1) a plurality of α-silicon carbide diodes made with a solvent alloy consisting of 2 wt. percent Ti or Zr, 20 wt. percent SiC, and the remainder chromium; and (2) a plurality of α-silicon carbide diodes made with a solvent alloy consisting of about 80% chromium and about 20% silicon carbide. FIG. 2 summarizes the general trend observed and relates the light output power as a function of forward-bias current density. Since there was considerable scatter between the various diodes examined, the results are presented as bands rather than single lines. The band 16 represents the light output of diodes with Ti or with Zr as the added impurity, while the band 18 represents the light output of diodes made under the same conditions but without Ti and Zr. It is believed to be evident that for a given forward-bias current density diodes with Ti or Zr provide a substantially greater light output than diodes lacking Ti and Zr.

FIG. 3 graphically demonstrates the effect of manganese on the light output of silicon carbide diodes. Curve 20 illustrates the electroluminescence spectrum of diodes made according to the foregoing process using a solvent alloy comprising 2 wt. percent manganese, 20 wt. percent SiC, and 76% Cr, while curve 22 illustrates the same property of diodes made according to the same process but with a solvent alloy consisting of 20% SiC and 80% Cr. It is clear that manganese causes the peak of the emitted radiation to shift from the green towards the red. In this connection it is to be noted that variations in the concentration of the major (nitrogen and aluminum) dopants do not yield any change in electroluminescence corresponding to that occurring due to the presence of manganese.

Although in the foregoing example of manufacturing diodes embodying the present invention the solvent zone was passed through the N-type silicon carbide, it also may be passed through the P-type silicon carbide to form a P–N junction. The electrical characteristics are essentially the same regardless of whether the solvent zone is passed through the N-type or P-type silicon carbide. The changes in electroluminescence are due essentially to the presence of the transition metal and not by passing the chromium through a particular type (P or N) silicon carbide. However, it is preferred to grow through the N-type wafer as above-described since it is easier to maintain the high original doping levels simply by the introduction of a small quantity of nitrogen into the atmosphere surrounding the sandwich.

It is also to be noted that the solvent alloy need not include silicon carbide but instead may consist of chromium and the selected transition metal. The purpose of including silicon carbide in the solvent alloy is to virtually saturate the chromium solvent with solute, i.e., silicon carbide, prior to heating. It has been found that there is a tendency for a thin almost colorless region to occur at the P-N junction and we hypothesized that it resulted from the removal of both aluminum and nitrogen in the form of the compound AlN during the initial stage of growth when the chromium is being saturated with SiC. Aluminum nitride is insoluble in silicon carbide and hence would tend to be contained in the liquid phase during growth. By presaturating the chromium with silicon carbide, absolutely no evidence of the clear region is obtained and the junction region is relatively abrupt.

We have determined that the solvent (whether Cr or Cr-SiC) should comprise at least about one weight percent of the selected transition metal in order to obtain the effects corresponding to those illustrated in FIG. 2 or 3. Between 2 and 4 wt. percent appears to be best. More than 4 wt. percent is difficult to achieve because of solubility factors. The exact concentration of transition metal that is required to be present in the crystal per se and particularly at the junction region is not known, but it must be sufficient to increase the light output or, as in the case of manganese, to effect a shift in the peak of the electroluminescence spectrum.

It is to be recognized also that diodes embodying the present invention may be made by still other processes. For example, it is possible to grow silicon carbide crystals with a P-N junction according to the process described in U.S. Pat. No. 2,854,364, issued Sept. 30, 1958, to J. A. Lely for "Sublimation Process for Manufacturing Silicon Carbide Crystals." Essentially the Lely process involves placing pure silicon carbide in a graphite vessel, heating the vessel to a temperature at which silicon carbide vaporizes and decomposes into its constituent atoms which deposit on unvaporized portions of silicon carbide in the form of single crystals, and flowing a gas mixture constituted of a protective gas such as argon and a gaseous acceptor or donor impurity at a controlled vapor pressure so that atoms of the impurity are incorporated into the single crystals to give them the desired semiconductivity. A P-N junction can be achieved by altering or changing the impurity gas, e.g. from $AlCl_3$ to nitrogen. For the purpose of this invention the Lely process is modified by including a gas of transition metal, e.g. $TiCl_4$, into the gaseous mixture while the P-type or the N-type regions are being grown or when the junction is being grown. It is also possible to produce diodes with titanium, zirconium or manganese additives by modification of the process described in U.S. Pat. No. 3,147,159, issued Sept. 1, 1944, to E. C. Lowe for "Hexagonal Silicon Carbide Crystals Produced From an Elemental Silicon Vapor Deposited Onto a Carbon Plate." Still other processes for making junction semiconductor devices may be adapted by persons skilled in the art to practice the present invention.

It is to be understood also that although the foregoing description is concerned with α-silicon carbide, the invention also is applicable to diodes made of β-silicon carbide. Obviously many other modifications and variations of the present invention also are possible in view of the above teachings so that, for example, still other transition metals may be introduced into the crystal lattice to produce still other changes in the electroluminescent output of silicon carbide diodes.

It is to be understood, therefore, that the invention is not limited to the terms and procedures specifically described or illustrated and that within the scope of the appended claims, it may be practiced otherwise than as specifically described or illustrated within the skill of the art.

We claim:

1. A silicon carbide semiconductor junction device capable of electroluminescing in response to a forward-bias current comprising a single crystal body of semiconductor silicon carbide having a P-N junction and containing at the region of said junction a metal impurity in elemental form from the group consisting of titanium, zirconium and manganese, and non-rectifying connections to said crystal body on each side of said junction.

2. A semiconductor junction device as defined by claim 1 wherein said metal impurity is titanium.

3. A semiconductor junction device as defined by claim 1 wherein said metal impurity is zirconium.

4. A semiconductor junction device as defined by claim 1 wherein said metal impurity is manganese.

References Cited

UNITED STATES PATENTS

| | | | |
|---|---|---|---|
| 3,047,439 | 7/1962 | Van Daal et al. | 148—33 |
| 3,371,255 | 2/1968 | Belasco et al. | 317—237 |
| 3,377,210 | 4/1968 | Somerville et al. | 148—1.5 |
| 3,395,445 | 8/1968 | Ovshinsky | 29—569 |
| 3,396,059 | 8/1968 | Giammanco | 148—171 |
| 3,397,333 | 8/1968 | Jastram et al. | 310—68 |
| 3,401,107 | 10/1968 | Redington | 204—164 |

JOHN W. HUCKERT, Primary Examiner

M. H. EDLOW, Assistant Examiner

U.S. Cl. X.R.

317—234; 148—33